US009857653B2

(12) United States Patent
Chen et al.

(10) Patent No.: US 9,857,653 B2
(45) Date of Patent: Jan. 2, 2018

(54) THIN FILM TRANSISTOR ARRAY SUBSTRATE AND LIQUID CRYSTAL DISPLAY PANEL

(71) Applicants: Shenzhen China Star Optoelectronics Technology Co., Ltd., Shenzhen, Guangdong (CN); WUHAN CHINA STAR OPTOELECTRONICS TECHNOLOGY CO., LTD, Wuhan, Hubei (CN)

(72) Inventors: Gui Chen, Guangdong (CN); Caiqin Chen, Guangdong (CN)

(73) Assignees: Shenzhen China Star Optoelectronics Technology Co., Ltd, Shenzhen, Guangdong (CN); WUHAN CHINA STAR OPTOELECTRONICS TECHNOLOGY CO., LTD, Wuhan, Hubei (CN)

( * ) Notice: Subject to any disclaimer, the term of this patent is extended or adjusted under 35 U.S.C. 154(b) by 82 days.

(21) Appl. No.: 14/908,101

(22) PCT Filed: Nov. 23, 2015

(86) PCT No.: PCT/CN2015/095287
§ 371 (c)(1),
(2) Date: Jan. 27, 2016

(87) PCT Pub. No.: WO2017/054301
PCT Pub. Date: Apr. 6, 2017

(65) Prior Publication Data
US 2017/0261824 A1   Sep. 14, 2017

(30) Foreign Application Priority Data
Sep. 28, 2015   (CN) .......................... 2015 1 0626558

(51) Int. Cl.
*G02F 1/1362*   (2006.01)
*G06F 3/041*   (2006.01)
(Continued)

(52) U.S. Cl.
CPC ...... *G02F 1/136286* (2013.01); *G02F 1/1368* (2013.01); *G02F 1/13338* (2013.01);
(Continued)

(58) Field of Classification Search
CPC .......... G02F 1/136286; G02F 1/13338; G02F 1/1368; G06F 3/041; G06F 2001/13606; G06F 2201/121; H01L 27/124
(Continued)

(56) References Cited

U.S. PATENT DOCUMENTS

2014/0152918 A1* 6/2014 Lee .................... G02F 1/13338
                                                              349/12
2016/0077624 A1* 3/2016 Zhao .................... H04L 45/245
                                                              345/174

* cited by examiner

*Primary Examiner* — Cuong Q Nguyen
*Assistant Examiner* — Tong-Ho Kim
(74) *Attorney, Agent, or Firm* — Andrew C. Cheng (57) ABSTRACT

The present invention provides a thin film transistor array substrate and a liquid crystal display panel. The thin film transistor array substrate comprises: a substrate, and the substrate comprises a first surface and a second surface oppositely located; a thin film transistor array, located on the first surface; a common electrode layer, and the common electrode layer is isolated from the thin film transistor array, and the common electrode layer comprises a plurality of first strip holes; a sensing electrode layer, and the sensing electrode layer is isolated from the common electrode layer, and the sensing electrode layer comprises a plurality of sensing units and a plurality of sensing wires, and the sensing units are distributed in row and column, and the sensing wires are electrically coupled to the sensing units of each row or each
(Continued)

column respectively, and the sensing wires are located corresponding to the first strip holes.

18 Claims, 6 Drawing Sheets (51) Int. Cl.
*G02F 1/1333* (2006.01)
*G02F 1/1368* (2006.01)
*G02F 1/136* (2006.01)
*H01L 27/12* (2006.01)

(52) U.S. Cl.
CPC .... G06F 3/041 (2013.01); *G02F 2001/13606* (2013.01); *G02F 2201/121* (2013.01); *H01L 27/124* (2013.01)

(58) Field of Classification Search
USPC .............................................. 257/72; 349/12
See application file for complete search history.

THIN FILM TRANSISTOR ARRAY SUBSTRATE AND LIQUID CRYSTAL DISPLAY PANEL

CROSS REFERENCE

This application claims the priority of Chinese Patent Application No. 201510626558.5, entitled "Thin film transistor array substrate and liquid crystal display panel", filed on Sep. 28, 2015, the disclosure of which is incorporated herein by reference in its entirety.

FIELD OF THE INVENTION

The present invention relates to a display skill field, and more particularly to a Thin film transistor array substrate and a liquid crystal display panel.

BACKGROUND OF THE INVENTION

The liquid crystal display (LCD) is a common electronic apparatus. It is favored by the users with its properties of low power consumption, small volume and light weight. The touch and display merge is also the popular field of the display panel researches, and the Low Temperature Poly-Silicon (LTPS) is considered to be the high end technology of the field. The in cell technology is to embed the touch panel function into the liquid crystal pixel. In the design process of the traditional pixel, the sensing wires of the sensing electrodes, the gate lines and the data lines have larger overlapping area with the common electrode layer. Therefore, larger capacitances are formed between the sensing wires of the sensing electrodes and the common electrode, between the gate lines and the common electrode and between the data lines and the common electrode. Meanwhile, resistances exist among the sensing wires of the sensing electrodes, the gate lines, the data lines and the common electrode. Thus, the resistance-capacitance (RC) loading of the pixel is larger, and the display result of the entire liquid crystal display panel is influenced. In conclusion, the RC loading of the pixel in prior art is larger, and the display result of the entire liquid crystal display panel is not ideal.

SUMMARY OF THE INVENTION

The present invention provides a thin film transistor array substrate, and the thin film transistor array substrate comprises:

a substrate, and the substrate comprises a first surface and a second surface, which are oppositely located;

a thin film transistor array, located on the first surface;

a common electrode layer, and the common electrode layer is isolated from the thin film transistor array, and the common electrode layer comprises a plurality of first strip holes;

a sensing electrode layer, and the sensing electrode layer is isolated from the common electrode layer, and the sensing electrode layer comprises a plurality of sensing units and a plurality of sensing wires, and the sensing units are distributed in row and column, and the sensing wires are electrically coupled to the sensing units of each row or each column respectively, and the sensing wires are located corresponding to the first strip holes.

The thin film transistor array substrate further comprises:

a plurality of gate lines, located on the thin film transistor array, and the gate lines are aligned along a first direction and extend along a second direction;

a plurality of data lines, located above the gate lines, and the data lines are aligned along the second direction and extend along the first direction;

the common electrode layer is located above the data lines, and isolated from the data lines and the gate lines, and the first strip holes are located corresponding to the gate lines, or the first strip holes are located corresponding to the data lines.

As the first strip holes are located corresponding to the gate lines, a width of the first strip hole corresponding to the gate line is smaller or equal to a width of the gate line; as the first strip holes are located corresponding to the data lines, a width of the first strip hole corresponding to the data line is smaller or equal to a width of the data line.

Each first strip hole comprises a plurality of first sub strip holes, and the first sub strip holes are located in spaces.

As the first strip holes are located corresponding to the gate lines, the first sub strip holes are aligned along the first direction and extend along the second direction; as the first strip holes are located corresponding to the data lines, the first sub strip holes are aligned along the second direction and extend along the first direction.

The thin film transistor array substrate further comprises second strip holes, and as the first strip holes are located corresponding to the gate lines, the second strip holes are located corresponding to the data lines; as the first strip holes are located corresponding to the data lines, the second strip holes are located corresponding to the gate lines.

As the second strip holes are located corresponding to the data lines, a width of the second strip hole corresponding to the data line is smaller or equal to a width of the data line; as the second strip holes are located corresponding to the gate lines, a width of the second strip hole corresponding to the gate line is smaller or equal to a width of the gate line.

Each second strip hole comprises a plurality of second sub strip holes, and the second sub strip holes are located in spaces.

As the second strip holes are located corresponding to the data lines, the second sub strip holes are aligned along the second direction and extend along the first direction; as the second strip holes are located corresponding to the gate lines, the second sub strip holes are aligned along the first direction and extend along the second direction.

The present invention further provides a liquid crystal display panel, and the liquid crystal display panel comprises the thin film transistor array substrate described in any of the aforesaid embodiments.

Compared with prior art, in the thin film transistor array substrate and the liquid crystal display panel of the present invention, the first strip holes are located at the common electrode layer, and the first strip holes are located corresponding to the sensing wires to decrease the overlapping area between the common electrode layer and the sensing wires. Accordingly, the capacitance between the common electrode layer and the sensing wires is decreased to reduce the RC loading of the pixel and to promote the display quality of the liquid crystal display panel utilizing the thin film transistor array substrate.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
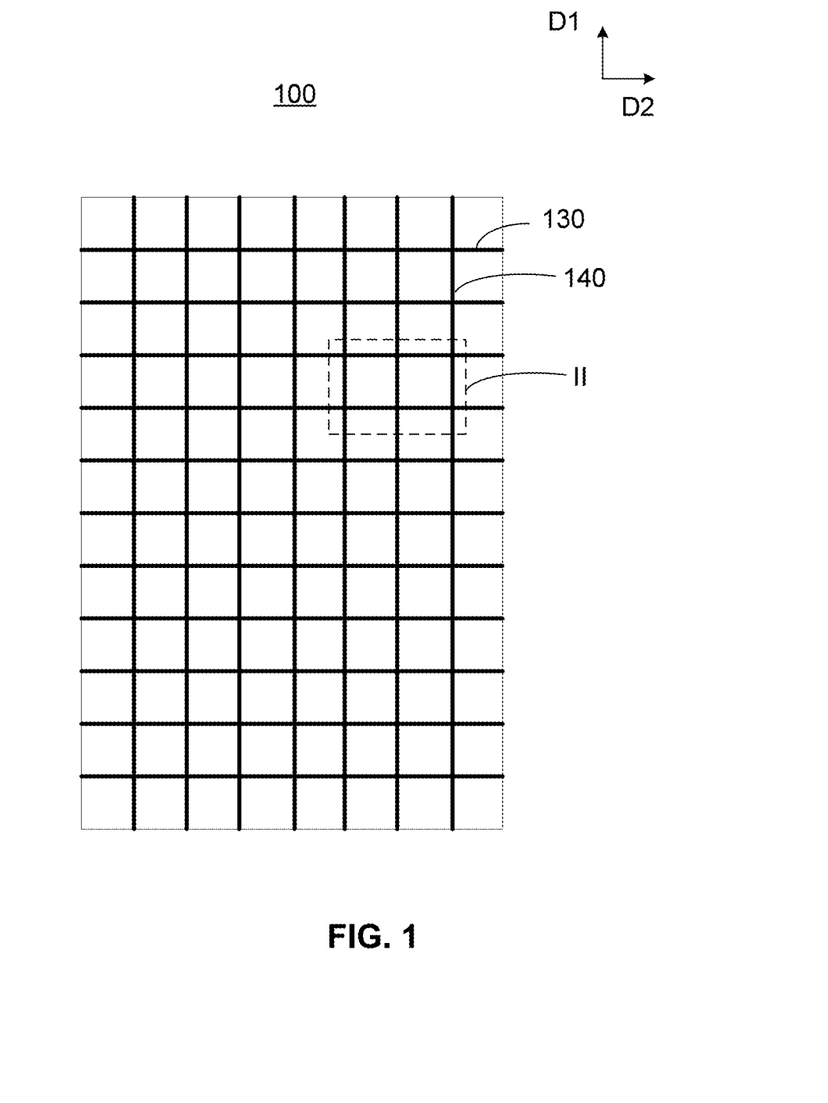
FIG. 1 is a structure diagram of a thin film transistor array substrate according to on preferred embodiment of the present invention.
Figure 2:
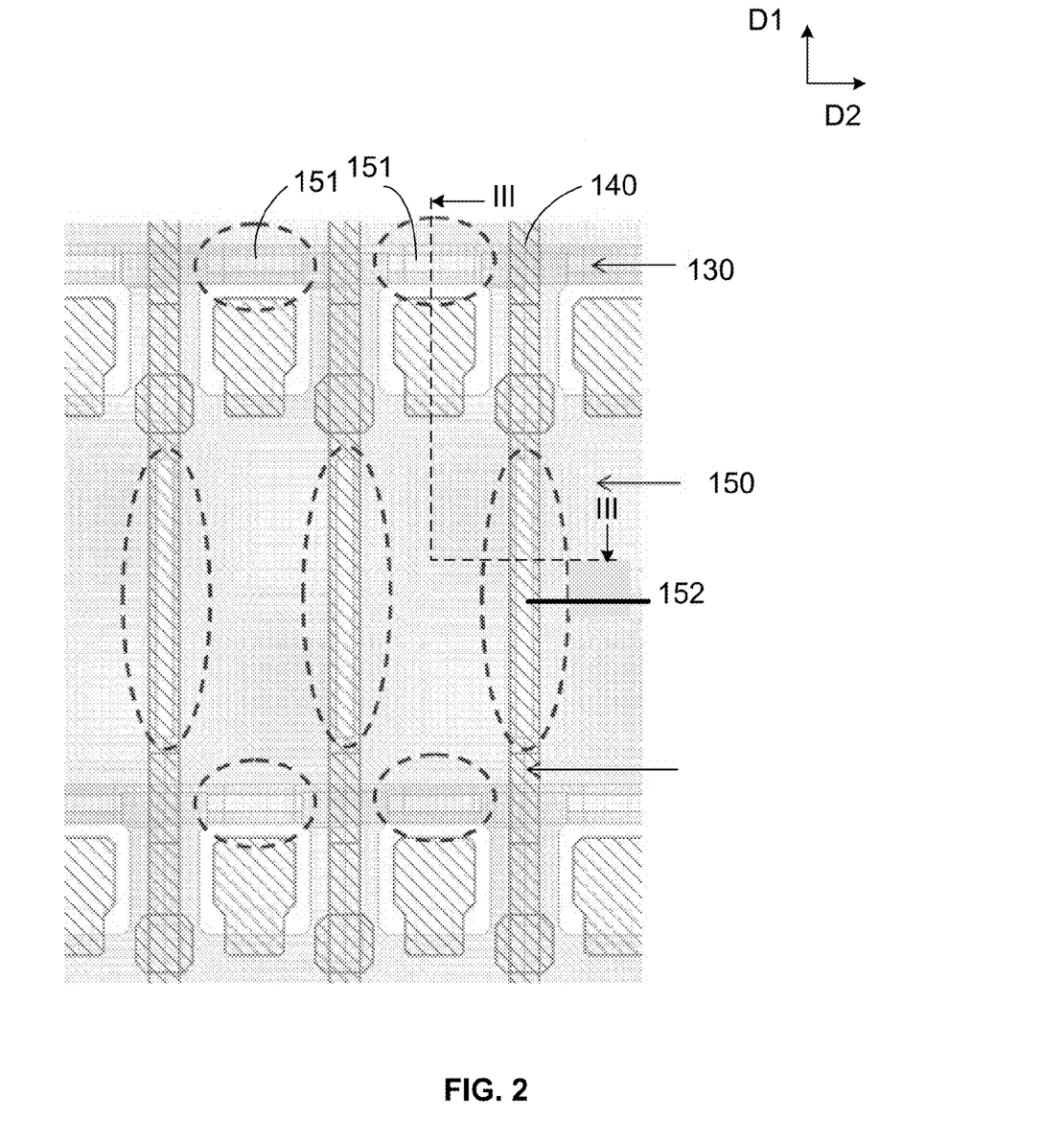
FIG. 2 is an enlarged structure diagram of II position in FIG. 1 of the present invention.
Figure 3:
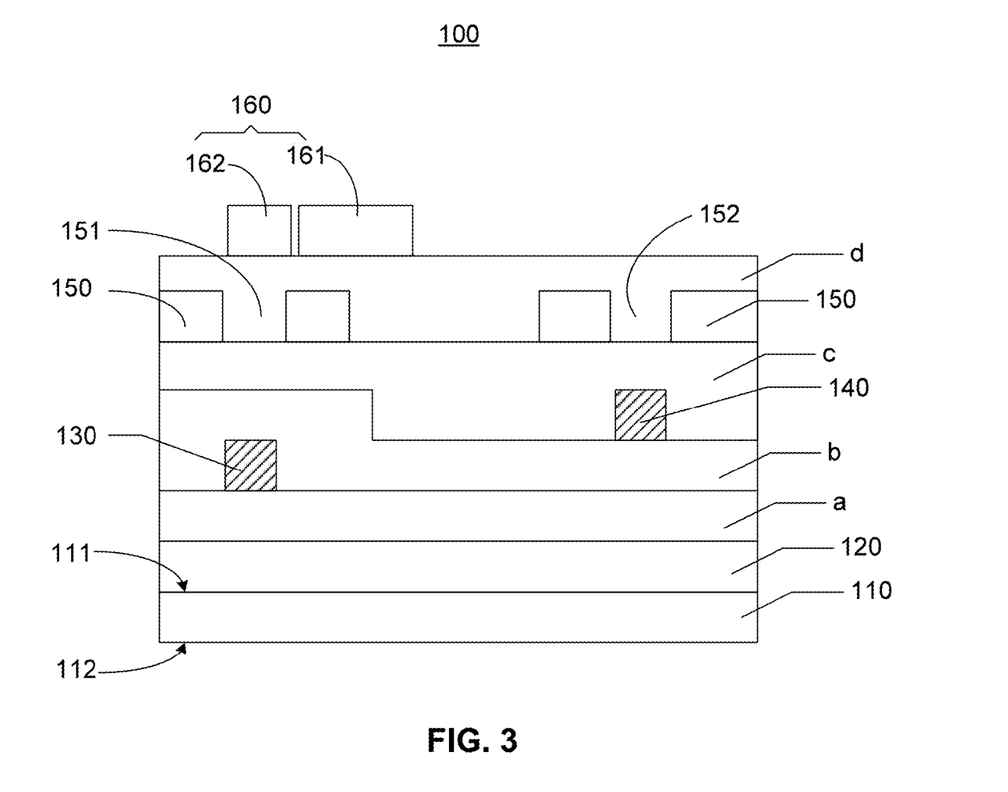
FIG. 3 is a sectional structure diagram of III-III in FIG. 2 of the present invention.

Please refer to FIG. 1, FIG. 2 and FIG. 3. FIG. 1 is a structure diagram of a thin film transistor array substrate according to on preferred embodiment of the present invention; FIG. 2 is an enlarged structure diagram of II position in FIG. 1 of the present invention; FIG. 3 is a sectional structure diagram of III-III in FIG. 2 of the present invention. The thin film transistor array substrate 100 comprises a substrate 110, a thin film transistor array 120, a sensing electrode layer 160, a plurality of gate lines 130, a plurality of data lines 140 and a common electrode layer 150. The substrate 110 comprises a first surface 111 and a second surface 112, which are oppositely located. The thin film transistor array 120 is located on the first surface 111. The common electrode layer 150 is isolated from the thin film transistor array 120, and the common electrode layer 150 comprises a plurality of first strip holes 151. The sensing electrode layer 160 is isolated from the common electrode layer 150, and the sensing electrode layer 160 comprises a plurality of sensing units 161 and a plurality of sensing wires 162, and the sensing units 161 are distributed in row and column, and the sensing wires 162 are electrically coupled to the sensing units of each row or each column respectively, and the sensing wires 162 are located corresponding to the first strip holes 151.

The gate lines 130 are located on the thin film transistor array 120, and the gate lines 130 are aligned along a first direction D1 and extend along a second direction D2. The data lines 140 are located above the gate lines 130, and the data lines 140 are aligned along the second direction D2 and extend along the first direction D1. The common electrode layer 150 is located above the data lines 140, and isolated from the data lines 140 and the gate lines 130, and the first strip holes 151 are located corresponding to the gate lines 130, or the first strip holes 151 are located corresponding to the data lines 140.

The substrate 110 can be a transparent substrate, such as a glass substrate, a plastic substrate. In this embodiment, no restriction is claimed to the material of the substrate 110. It is understandable that in this embodiment, it is illustrated that the thin film transistor array 120 is located on the first surface 111 of the substrate 110 for explanation. In this embodiment, the second surface 112 of the substrate 110 is the surface close to the backlight module. It is understandable that in other embodiments, the thin film transistor array 120 also can be located on the second surface 112. In such embodiment, the first surface 111 of the substrate 110 is the surface close to the backlight module.

The thin film transistor array 120 comprises a plurality of thin film transistors distributed in array. The thin film transistor is employed to control the pixel dot in the liquid crystal display panel. The thin film transistor comprises a gate, a source and a drain. The gate is employed to receive a gate voltage, and to control on or off of the source and the drain under the control of the gate voltage. When the source and the drain are on under the control of the gate voltage, the thin film transistor is activated; when the source and the drain are off under the control of the gate voltage, the thin film transistor is deactivated.

The gate lines 130 are located above the thin film transistor array 120, and an isolation layer a is located between the gate lines 130 and the thin film transistor array 120, and the gate line 130 is electrically coupled to the gate of the thin film transistor, and employed to output the gate voltage. The gate lines 130 are aligned along the first direction D1 and extend along the second direction D2. In this embodiment, the first direction D1 is the Y axis direction, and the second direction D2 is the X axis direction. It is understandable that in other embodiments, the first direction D1 and the second direction D2 can be not the Y axis direction and the X axis direction, and the first direction D1 and the second direction D2 can be not orthogonal.

The data lines 140 are located above the gate lines 130, and the data lines 140 and the gate lines 130 are isolated with each other, and the data lines 140 and the gate lines 130 are intersecting. The data lines 140 are aligned along the second direction D2 and extend along the first direction D1. In this embodiment, an isolation layer b is located between the data lines 140 and the gate lines 130 to achieve the mutual isolation of the data lines 140 and the gate lines 130.

The common electrode layer 150 is located above the data lines 140, and isolated with the data lines 140 and the gate lines 130. Specifically, an isolation layer c can be located on the data lines 140, and the common electrode layer 150 is located on the isolation layer c. The material of the isolation layer c can be one of Silicon Nitride (SiNx), Silicon Oxide (SiO2), silicon oxynitride and the combination thereof but not limited thereto.

In this embodiment, it is illustrated that the first strip holes 151 are located corresponding to the gate lines 130 for description. Then, as the first strip holes 151 are located corresponding to the gate lines 130, a width of the first strip hole 151 corresponding to the gate line 130 is smaller or equal to a width of the gate line 130. As the first strip holes 151 are located corresponding to the data lines 130, and the gate lines 130 are aligned along the first direction D1 and extend along the second direction D2. Therefore, the width of the gate line 130 is the dimension along the first direction D1. The dimension of the first strip hole 151 corresponding to the width of the gate line 130 is the dimension of the first strip hole 151 in the first direction D1. The width of the first strip hole 151 corresponding to the gate line 130 is smaller or equal to the width of the gate line 130. Namely, the dimension of the first strip hole 151 in the first direction D1 is smaller than or equal to the width of the gate line 130.

It is understandable that in other embodiments, as the first strip holes 151 are located corresponding to the data lines 140, a width of the first strip hole 151 corresponding to the first data line 140 is smaller or equal to a width of the data line 140. As the first strip holes 151 are located corresponding to the data lines 140, and the data lines 140 are aligned along the second direction D2 and extend along the first direction D1. Therefore, the width of the data line 140 is the dimension along the second direction D2. The dimension of the first strip hole 151 corresponding to the width of the data line 140 is the dimension of the first strip hole 151 in the second direction D2. The width of the first strip hole 151 corresponding to the data line 140 is smaller or equal to the width of the data line 140. Namely, the dimension of the first strip hole 151 in the second direction D2 is smaller than or equal to the width of the data line 140.

Figure 4:
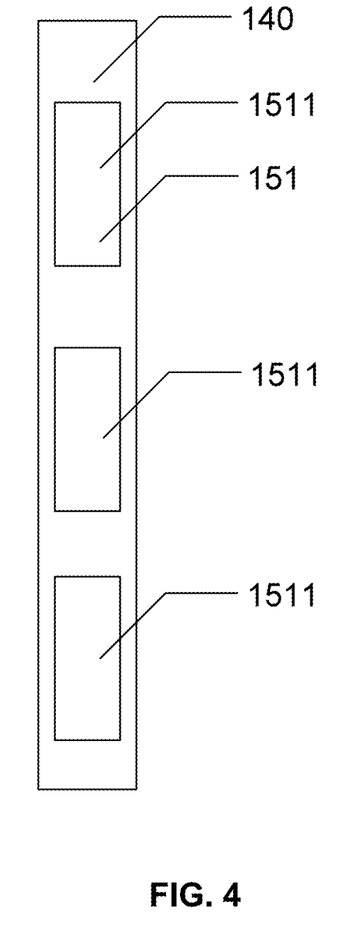
FIG. 4 is a distribution diagram of first sub strip holes in a first strip hole.

In one embodiment, each first strip hole 151 comprises a plurality of first sub strip holes 1511, and the first sub strip holes 1511 are located in spaces. As the first strip holes 151 are located corresponding to the gate lines 130, the first sub strip holes 1511 are aligned along the first direction D1 and extend along the second direction D2. Please refer to FIG. 4. As the first strip holes 151 are located corresponding to the data lines 140, the first sub strip holes 1511 are aligned along the second direction D2 and extend along the first direction D1. It is understandable that shapes of the respective first sub strip holes 1511 can be the same or can be different. In this embodiment, no restriction to the first sub strip hole 1511 is claimed here.

The thin film transistor array substrate 100 further comprises second strip holes 152, and as the first strip holes 151 are located corresponding to the gate lines 130, the second strip holes 152 are located corresponding to the data lines 140. As the first strip holes 151 are located corresponding to the data lines 140, the second strip holes 152 are located corresponding to the gate lines 130.

As the second strip holes 152 are located corresponding to the data lines 140, a width of the second strip holes 152 corresponding to the data line 140 is smaller or equal to a width of the data line 140. As the second strip holes 152 are located corresponding to the gate lines 130, the dimension of the second strip hole 152 corresponding to the width of the gate line 130 is smaller than or equal to the width of the gate line 130.

Figure 5:
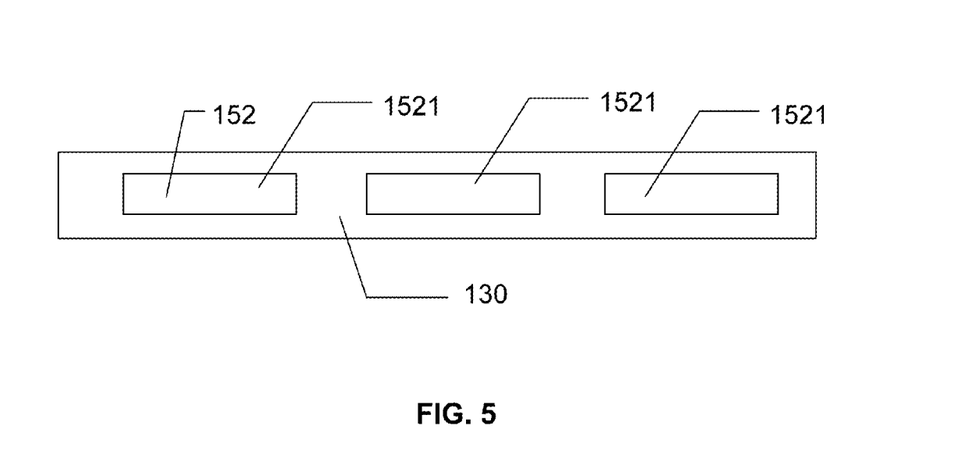
FIG. 5 is a distribution diagram of second sub strip holes in a second strip hole.

In one embodiment, each second strip hole 152 comprises a plurality of second sub strip holes 1521, and the second sub strip holes 1521 are located in spaces. As the second strip holes 152 are located corresponding to the data lines 140, the second sub strip holes 1521 are aligned along the second direction D2 and extend along the first direction D1. As the second strip holes 152 are located corresponding to the gate lines 130, the second sub strip holes 1521 are aligned along the first direction D1 and extend along the second direction D2, as shown in FIG. 5.

It is understandable that the thin film transistor array substrate 100 can merely comprise the first strip holes 151. The first strip hole 151 comprises a plurality of first sub strip holes 1511 as aforementioned. Or, the thin film transistor array substrate 100 can merely comprise the second strip holes 152. The second strip hole 152 comprises a plurality of second sub strip holes 1521 as aforementioned. Or, the thin film transistor array substrate 100 can comprise the first strip holes 151 and the second strip hole 152. The first strip hole 151 comprises a plurality of first sub strip holes 1511 as aforementioned. Or, the thin film transistor array substrate 100 can comprise the first strip holes 151 and the second strip hole 152. The second strip hole 152 comprises a plurality of second sub strip holes 1521 as aforementioned. Or, the thin film transistor array substrate 100 comprises the first strip holes 151 and the second strip hole 152. The first strip hole 151 comprises a plurality of first sub strip holes 1511 as aforementioned and the second strip hole 152 comprises a plurality of second sub strip holes 1521 as aforementioned.

The sensing electrode layer 160 is transparent. The material of the sensing electrode 160 can be Indium Oxide but not limited thereto. The sensing units of each row or each column in the sensing electrode layer 160 are electrically coupled to a driving chip through a sensing wire 162 (touch panel trace). The sensing unit 160 is employed to receive the electrical signal outputted by the driving chip, and transmits the variation of the sensed signals to the driving chip for process. In this embodiment, the sensing electrode layer 160 is located above the common electrode layer 150 with the isolation layer d. In this embodiment, the sensing electrode layer 160 has the touch sensing function. Namely, in this embodiment, the touch panel function is embedded in the liquid crystal pixel, i.e. the in cell technology.

Compared with prior art, in the thin film transistor array substrate 100 of the present invention, the first strip holes 151 are located at the common electrode layer 150, and the first strip holes 151 are located corresponding to the sensing wires 162 to decrease the overlapping area between the common electrode layer 150 and the sensing wires 162. Accordingly, the capacitance between the common electrode layer 150 and the sensing wires 162 is decreased to reduce the RC loading of the pixel and to promote the display quality of the liquid crystal display panel utilizing the thin film transistor array substrate 100.

Furthermore, in the thin film transistor array substrate 100 of the present invention, the first strip holes 151 are located at the common electrode layer 150, and the first strip holes 151 are located corresponding to the gate lines 130 or the data lines 140 to decrease the overlapping area between the common electrode layer 150 and the gate lines 130 or the data lines 140. Accordingly, the capacitance between the common electrode layer 150 and the gate lines 130 or the capacitance between the common electrode layer 150 and the data lines 140 is decreased to reduce the RC loading of the pixel and to promote the display quality of the liquid crystal display panel utilizing the thin film transistor array substrate 100.

Figure 6:
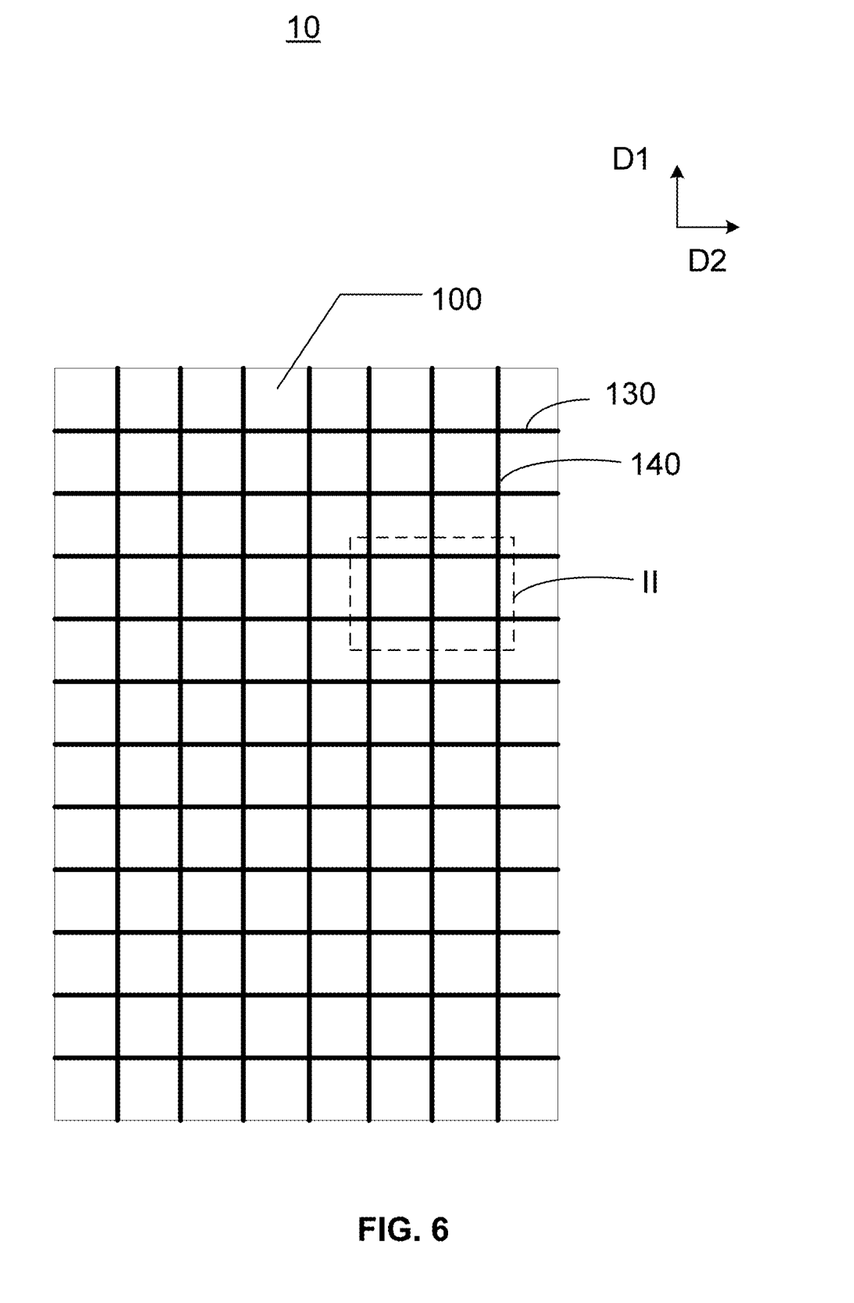
FIG. 6 is a structure diagram of a liquid crystal display panel according to one preferred embodiment of the present invention.

With combination of FIG. 1 to FIG. 5, the liquid crystal display of the present invention is introduced. Please refer to FIG. 6. FIG. 6 is a structure diagram of a liquid crystal display panel according to one preferred embodiment of the present invention. The liquid crystal display panel 10 comprises the thin film transistor array substrate 100. The thin film transistor array substrate 100 can be referred to the aforementioned description. The repeated description is omitted here.

Above are embodiments of the present invention, which does not limit the scope of the present invention. Any modifications, equivalent replacements or improvements within the spirit and principles of the embodiment described above should be covered by the protected scope of the invention.

What is claimed is:

1. A thin film transistor array substrate, wherein the thin film transistor array substrate comprises:

a substrate, and the substrate comprises a first surface and a second surface, which are oppositely located;

a thin film transistor array, located on the first surface;
a common electrode layer, and the common electrode layer is isolated from the thin film transistor array, and the common electrode layer comprises a plurality of first strip holes;
a sensing electrode layer, and the sensing electrode layer is isolated from the common electrode layer, and the sensing electrode layer comprises a plurality of sensing units and a plurality of sensing wires, and the sensing units are distributed in row and column, and the sensing wires are electrically coupled to the sensing units of each row or each column respectively, and the sensing wires are located corresponding to the first strip holes.

2. The thin film transistor array substrate according to claim 1, wherein the thin film transistor array substrate further comprises:
a plurality of gate lines, located on the thin film transistor array, and the gate lines are aligned along a first direction and extend along a second direction;
a plurality of data lines, located above the gate lines, and the data lines are aligned along the second direction and extend along the first direction;
the common electrode layer is located above the data lines, and isolated from the data lines and the gate lines, and the first strip holes are located corresponding to the gate lines, or the first strip holes are located corresponding to the data lines.

3. The thin film transistor array substrate according to claim 2, wherein as the first strip holes are located corresponding to the gate lines, a width of the first strip hole corresponding to the gate line is smaller or equal to a width of the gate line; as the first strip holes are located corresponding to the data lines, a width of the first strip hole corresponding to the data line is smaller or equal to a width of the data line.

4. The thin film transistor array substrate according to claim 2, wherein the thin film transistor array substrate further comprises second strip holes, and as the first strip holes are located corresponding to the gate lines, the second strip holes are located corresponding to the data lines; as the first strip holes are located corresponding to the data lines, the second strip holes are located corresponding to the gate lines.

5. The thin film transistor array substrate according to claim 4, wherein as the second strip holes are located corresponding to the data lines, a width of the second strip hole corresponding to the data line is smaller or equal to a width of the data line; as the second strip holes are located corresponding to the gate lines, a width of the second strip hole corresponding to the gate line is smaller or equal to a width of the gate line.

6. The thin film transistor array substrate according to claim 5, wherein each second strip hole comprises a plurality of second sub strip holes, and the second sub strip holes are located in spaces.

7. The thin film transistor array substrate according to claim 6, wherein as the second strip holes are located corresponding to the data lines, the second sub strip holes are aligned along the second direction and extend along the first direction; as the second strip holes are located corresponding to the gate lines, the second sub strip holes are aligned along the first direction and extend along the second direction.

8. The thin film transistor array substrate according to claim 1, wherein each first strip hole comprises a plurality of first sub strip holes, and the first sub strip holes are located in spaces.

9. The thin film transistor array substrate according to claim 8, wherein as the first strip holes are located corresponding to the gate lines, the first sub strip holes are aligned along the first direction and extend along the second direction; as the first strip holes are located corresponding to the data lines, the first sub strip holes are aligned along the second direction and extend along the first direction.

10. A liquid crystal display panel, wherein the liquid crystal display comprises a thin film transistor array substrate, and the thin film transistor array substrate comprises:
a substrate, and the substrate comprises a first surface and a second surface, which are oppositely located;
a thin film transistor array, located on the first surface;
a common electrode layer, and the common electrode layer is isolated from the thin film transistor array, and the common electrode layer comprises a plurality of first strip holes;
a sensing electrode layer, and the sensing electrode layer is isolated from the common electrode layer, and the sensing electrode layer comprises a plurality of sensing units and a plurality of sensing wires, and the sensing units are distributed in row and column, and the sensing wires are electrically coupled to the sensing units of each row or each column respectively, and the sensing wires are located corresponding to the first strip holes.

11. The liquid crystal display panel according to claim 10, wherein the thin film transistor array substrate further comprises:
a plurality of gate lines, located on the thin film transistor array, and the gate lines are aligned along a first direction and extend along a second direction;
a plurality of data lines, located above the gate lines, and the data lines are aligned along the second direction and extend along the first direction;
the common electrode layer is located above the data lines, and isolated from the data lines and the gate lines, and the first strip holes are located corresponding to the gate lines, or the first strip holes are located corresponding to the data lines.

12. The liquid crystal display panel according to claim 11, wherein as the first strip holes are located corresponding to the gate lines, a width of the first strip hole corresponding to the gate line is smaller or equal to a width of the gate line; as the first strip holes are located corresponding to the data lines, a width of the first strip hole corresponding to the data line is smaller or equal to a width of the data line.

13. The liquid crystal display panel according to claim 11, wherein the thin film transistor array substrate further comprises second strip holes, and as the first strip holes are located corresponding to the gate lines, the second strip holes are located corresponding to the data lines; as the first strip holes are located corresponding to the data lines, the second strip holes are located corresponding to the gate lines.

14. The liquid crystal display panel according to claim 13, wherein as the second strip holes are located corresponding to the data lines, a width of the second strip hole corresponding to the data line is smaller or equal to a width of the data line; as the second strip holes are located corresponding to the gate lines, a width of the second strip hole corresponding to the gate line is smaller or equal to a width of the gate line.

15. The liquid crystal display panel according to claim 14, wherein each second strip hole comprises a plurality of second sub strip holes, and the second sub strip holes are located in spaces.

16. The liquid crystal display panel according to claim 15, wherein as the second strip holes are located corresponding to the data lines, the second sub strip holes are aligned along the second direction and extend along the first direction; as the second strip holes are located corresponding to the gate lines, the second sub strip holes are aligned along the first direction and extend along the second direction.

17. The liquid crystal display panel according to claim 10, wherein each first strip hole comprises a plurality of first sub strip holes, and the first sub strip holes are located in spaces.

18. The liquid crystal display panel according to claim 17, wherein as the first strip holes are located corresponding to the gate lines, the first sub strip holes are aligned along the first direction and extend along the second direction; as the first strip holes are located corresponding to the data lines, the first sub strip holes are aligned along the second direction and extend along the first direction.

* * * * *